(12) United States Patent
Hou et al.

(10) Patent No.: US 12,183,623 B2
(45) Date of Patent: Dec. 31, 2024

(54) SEMICONDUCTOR DEVICES AND METHODS FOR FABRICATING THE SAME

(71) Applicant: YANGTZE MEMORY TECHNOLOGIES CO., LTD., Wuhan (CN)

(72) Inventors: Huidan Hou, Wuhan (CN); Lan Yao, Wuhan (CN); Yanwei Shi, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 256 days.

(21) Appl. No.: 17/709,371

(22) Filed: Mar. 30, 2022

(65) Prior Publication Data

US 2023/0069612 A1    Mar. 2, 2023

Related U.S. Application Data

(63) Continuation of application No. PCT/CN2021/115539, filed on Aug. 31, 2021.

(51) Int. Cl.
| | |
|---|---|
| *H01L 21/00* | (2006.01) |
| *H01L 21/762* | (2006.01) |
| *H01L 27/092* | (2006.01) |
| *H10B 41/40* | (2023.01) |
| *H10B 43/40* | (2023.01) |

(52) U.S. Cl.
CPC .... *H01L 21/76229* (2013.01); *H01L 27/0922* (2013.01); *H10B 41/40* (2023.02); *H10B 43/40* (2023.02)

(58) Field of Classification Search
CPC .......... H01L 21/76229; H01L 27/0922; H10B 41/40; H10B 43/40
See application file for complete search history.

(56) References Cited

U.S. PATENT DOCUMENTS 10,475,791 B1 * 11/2019 Zang ................... H01L 29/7853
2017/0294356 A1   10/2017 Yeh et al.

FOREIGN PATENT DOCUMENTS

| CN | 1540740 A | 10/2004 |
|---|---|---|
| CN | 105575899 A | 5/2016 |

* cited by examiner

*Primary Examiner* — Richard A Booth
(74) *Attorney, Agent, or Firm* — BAYES PLLC

(57) ABSTRACT

A semiconductor device and a method for fabricating the same are disclosed. A substrate including a first device region and a second device region is provided. A first isolation structure is formed in the substrate of the first device region and a second isolation structure is formed in the substrate of the second device region. Ion implantation on the first isolation structure is performed. The first isolation structure and the second isolation structure are etched back to form a first recess in the first isolation structure and a second recess in the second isolation structure.

20 Claims, 6 Drawing Sheets

SEMICONDUCTOR DEVICES AND METHODS FOR FABRICATING THE SAME

CROSS-REFERENCE TO RELATED APPLICATIONS

This application is a continuation of International Application No. PCT/CN2021/115539, filed on Aug. 31, 2021, which is incorporated herein by reference in its entirety.

BACKGROUND

The present disclosure relates to the fields of electronic devices, and more particularly to semiconductor devices and methods for fabricating the same.

A three-dimensional (3D) NAND memory device includes a control chip that typically employs complementary metal oxide semiconductor (CMOS). In CMOS, there may exist both high voltage metal oxide semiconductor (HVMOS) transistors and low voltage metal oxide semiconductor (LVMOS) transistors at the same time. There may be also low low voltage metal oxide semiconductor (LLVMOS) transistors in CMOS, which have lower voltages than LVMOS.

In the current 3D-NAND process, HVMOS, LVMOS and LLVMOS devices have different voltages and therefore have different structure characteristics. For example, HVMOS has a deeper junction depth than LVMOS and LLVMOS. The deeper the junction depth is, the deeper recess needs to be formed in the isolation structure to satisfy the junction depth requirements of devices.

SUMMARY

The object of the present disclosure is to provide a semiconductor device and a method for fabricating the same intended to form a first recess and a second recess at the same time, with the depth of the first recess greater than that of the second recess to satisfy device demand.

In one aspect, the present disclosure provides a method for fabricating a semiconductor device, including:

providing a substrate comprising a first device region and a second device region;

forming a first isolation structure in the substrate of the first device region and forming a second isolation structure in the substrate of the second device region;

performing ion implantation on the first isolation structure; and then etching back the first isolation structure and the second isolation structure to form a first recess in the first isolation structure and a second recess in the second isolation structure, wherein the depth of the first recess in a longitudinal direction perpendicular to the substrate is greater than the depth of the second recess in the longitudinal direction.

In some embodiments, the depth of the first recess in the longitudinal direction is less than the depth of the first isolation structure in the longitudinal direction; and the depth of the second recess in the longitudinal direction is less than the depth of the second isolation structure in the longitudinal direction.

In some embodiments, the step of forming a first isolation structure in the substrate of the first device region and forming a second isolation structure in the substrate of the second device region comprises:

etching the substrate of the first device region to form a first trench;

etching the substrate of the first device region and the second device region to form a first isolation groove correspondingly at a location of the first trench and form a second isolation groove in the second device region; and filling the first isolation groove and the second isolation groove with a first insulating layer and a second insulating layer respectively to form the first isolation structure in the substrate of the first device region and form the second isolation structure in the substrate of the second device region;

wherein the depth of the first isolation groove in the longitudinal direction is greater than the depth of the second isolation groove in the longitudinal direction, and a difference between depths of the first isolation groove and the second isolation groove equals to the depth of the first trench in the longitudinal direction.

In some embodiments, the method further includes:

forming a first gate oxide layer on sidewalls of the first recess; and forming a second gate oxide layer on sidewalls of the second recess;

wherein an area of the first gate oxide layer is greater than an area of the second gate oxide layer.

In some embodiments, the method further includes:

forming the first gate oxide layer on a surface of the substrate of the first device region;

forming the second gate oxide layer on a surface of the substrate of the second device region.

In some embodiments, the method further includes:

forming a first gate layer on a surface of the first gate oxide layer to form a first gate structure comprising the first gate oxide layer and the first gate layer; and forming a second gate layer on a surface of the second gate oxide layer to form a second gate structure comprising the second gate oxide layer and the second gate layer.

In another aspect, the present disclosure provides a semiconductor device formed with the method for fabricating the semiconductor device according to any one of the above, including:

a substrate comprising a first device region and a second device region;

a first isolation structure in the substrate of the first device region, and the first isolation structure comprising a first insulating layer at a bottom;

a second isolation structure in the substrate of the second device region, and the second isolation structure comprising a second insulating layer at a bottom;

a first gate structure between the first device region and the first isolation structure and on the first insulating layer; and a second gate structure between the second device region and the second isolation structure and on the second insulating layer;

wherein there are implanted ions in the first insulating layer, and there are no implanted ions in the second insulating layer, and the depth of the first gate structure in a longitudinal direction perpendicular to the substrate is greater than the depth of the second gate structure in the longitudinal direction.

In some embodiments, the depth of the first isolation structure in the longitudinal direction is greater than the depth of the second isolation structure in the longitudinal direction.

In some embodiments, the semiconductor device further includes:

the first gate structure on a surface of the substrate of the first device region; and the second gate structure on a surface of the substrate of the second device region.

In some embodiments, the first gate structure comprises a first gate oxide layer and a first gate layer on a surface of the first gate oxide layer; and the second gate structure comprises a second gate oxide layer and a second gate layer on a surface of the second gate oxide layer.

In some embodiments, an area of the first gate oxide layer is greater than an area of the second gate oxide layer.

A semiconductor device and a method for fabricating the same are provided in the present disclosure, in which: a substrate including a first device region and a second device region is provided first; a first isolation structure is formed in the substrate of the first device region and a second isolation structure is formed in the substrate of the second device region; then ion implantation on the first isolation structure is performed; and next the first isolation structure and the second isolation structure are etched back to form a first recess in the first isolation structure and a second recess in the second isolation structure. Since the ion implantation on the first isolation structure is performed before etch back, the bombardment effect of the ion implantation process on the first isolation structure can cause the crystal lattice of the first isolation structure to be scattered. Therefore, the etching rate of the first isolation structure is greater than that of the second isolation structure in etch back process, thereby the depth of the formed first recess is greater than that of the second recess to satisfy device demands.

BRIEF DESCRIPTION OF THE DRAWINGS

Technical solutions and other beneficial effects of some embodiments of the present disclosure will become apparent by the following detailed description of specific implementations of the present disclosure in connection with the accompanying drawings. It can be understood that the drawings in the following description represent only some embodiments of the present disclosure.

DETAILED DESCRIPTION

Figure 1:
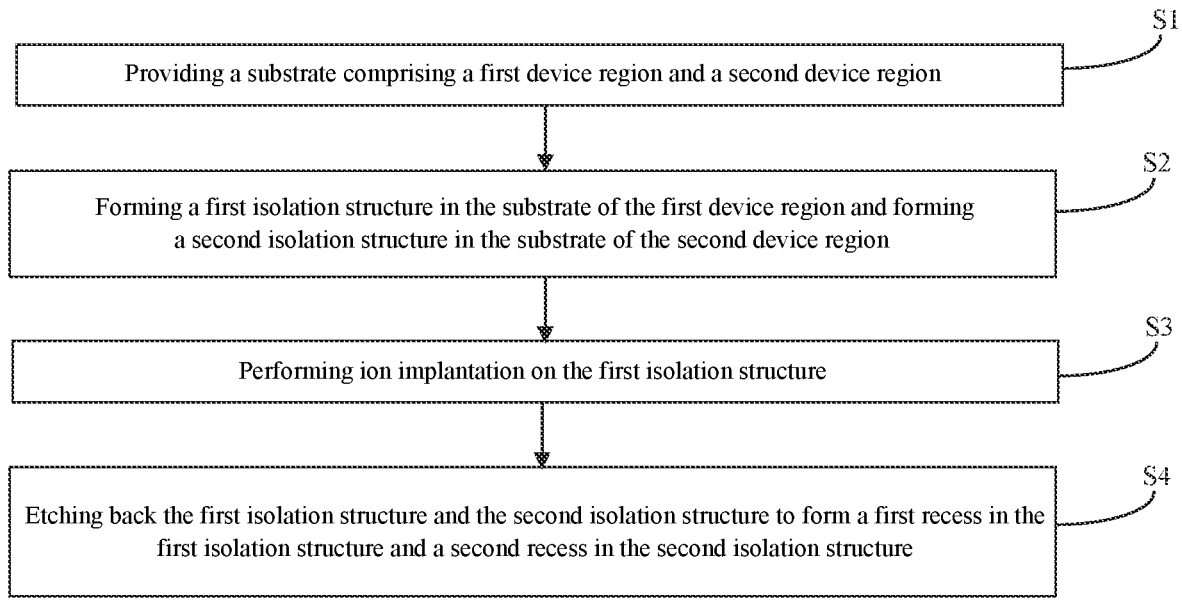
FIG. 1 is a schematic flow chart of an exemplary method for fabricating a semiconductor device, according to some embodiments of the present disclosure.

The technical solutions in some embodiments of the present disclosure will be clearly and fully described below in connection with the accompanying drawings. Obviously, the described embodiments represent only a part of some embodiments of the present disclosure rather than all of them. Based on the embodiments of the present disclosure, all other embodiments obtained by those skilled in the art without any creative work fall within the protection scope of the present disclosure.

It will be understood that, although the terms "first", "second", etc., may be used herein to describe various components, these components should not be limited by these terms. These terms may be used to distinguish one component from another. For example, a first component could be referred to as a second component, and, similarly, a second component could be referred to as a first component, without departing from the scope of the present disclosure.

It can be understood that when a component is referred to as being "on," "connected to," "connect with" another component, it may be directly on or connected to another component, or there may be intermediate components. Other words for describing the relationship among components may be interpreted similarly.

As used herein, the term "layer" may refer to a material portion including a region with a thickness. A layer may have a top side and a bottom side, wherein the bottom side of the layer may be relatively close to the substrate and the top side may be relatively far from the substrate. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductive and contact layers (in which contacts, interconnect lines are formed) and one or more dielectric layers.

As used herein, the term "semiconductor device" may refer to a semiconductor device with an array structure oriented vertically on a substrate oriented laterally such that the array structure may extend in the vertical direction relative to the substrate, wherein "vertical" may mean the direction perpendicular to a lateral direction of the substrate.

It is to be noted that diagrams provided in some embodiments of the present disclosure simply illustrate basic concepts of the present disclosure schematically; therefore although the drawings may only show the components related to the present disclosure rather than being drawn according to the number, the shape and size of the various components in actual implementation, type, quantity, and proportion of the components in the actual implementation may associate with an arbitrary change, and the layout of the components may be simplified.

Please refer to FIG. 1 which is a schematic flow chart of an exemplary method for fabricating a semiconductor device, according to some embodiments of the present disclosure. Further, FIGS. 2a-2k are schematic structure diagrams illustrating an exemplary fabricating process of the semiconductor device, according to some embodiments of the present disclosure. As shown, FIG. 1 illustrates the method including S1-S4.

At S1: A substrate 10 including a first device region 101 and a second device region 102 may be provided.

In some embodiments, the substrate 10 may be a semiconductor substrate such as silicon (Si), germanium (Ge), SiGe substrate, silicon on insulator (SOI) or germanium on insulator (GOI), etc. In other embodiments, the substrate 10 may also be a substrate including other elemental semiconductor or compound semiconductor and may also be a stack structure such as Si/SiGe, etc.

In some embodiments, the substrate 10 may include a first device region 101 that may include high voltage devices, e.g., HVMOSs, being formed therein, and a second device region 102 that may include low voltage devices, i.e., LVMOSs and LLVMOSs, being formed therein. HVMOSs may have high voltage well regions (or high voltage active regions), LVMOSs and LLVMOSs may have low voltage well regions (or low voltage active regions), and junction depths in high voltage well regions may be deeper than those in low voltage well regions. In some embodiments, it may be also necessary to form isolation structures such as shallow trench isolations (STIs) in each device region to isolate a plurality of active regions. Therefore, the depth of the isolation structure of the first device region may be deeper, and the depth of the recess formed in the isolation structure may also need to be deeper to satisfy device performance demands.

At S2: A first isolation structure 1012 may be formed in the substrate 10 of the first device region 101, and a second isolation structure 1022 may be formed in the substrate 10 of the second device region 102.

Figure 2A:
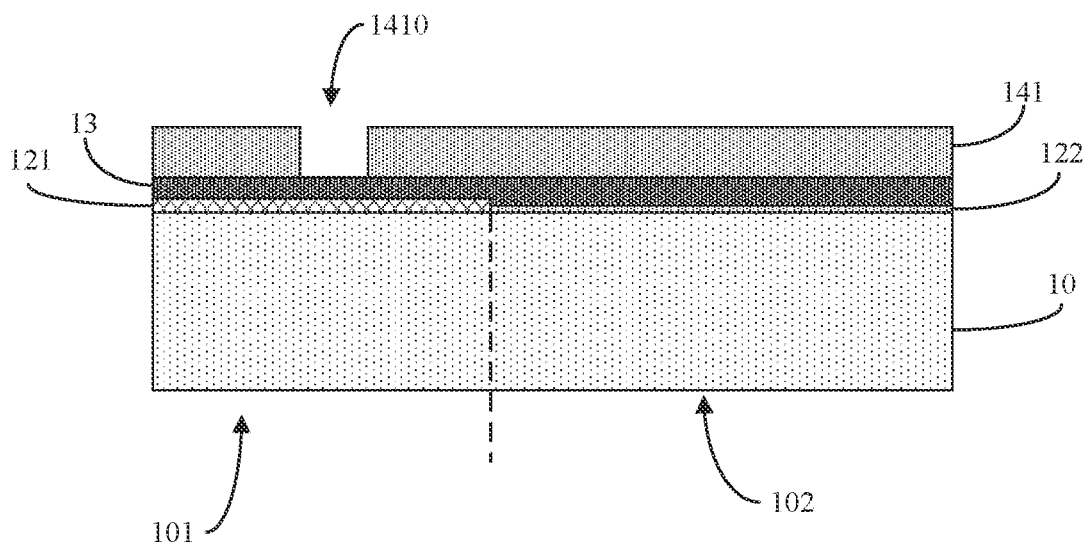
FIGS. 2a-2k are schematic structure diagrams illustrating an exemplary fabricating process of the semiconductor device, according to some embodiments of the present disclosure.

Before S2, as shown in FIG. 2a, a first gate oxide layer 121 in the first device region 101 and a second gate oxide layer 122 in the second device region 102 may be formed on the substrate 10. The thickness of the first gate oxide layer 121 may be greater than that of the second gate oxide layer 122.

Figure 2B:
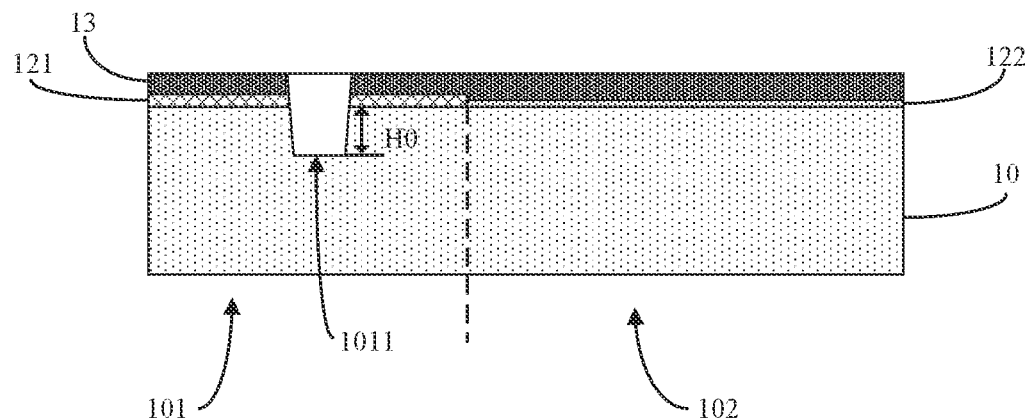

In some embodiments, S2 may include:

1) The substrate 10 of the first device region 101 may be etched to form a first trench 1011, as shown in FIGS. 2a-2b.

In some embodiments, a hard mask layer 13 and the gate oxide layer (including the first gate oxide layer 121 and second gate oxide layer 122) on the substrate 10 and a photoresist layer 141 on the hard mask layer 13 may be formed. The photoresist layer 141 may have a first opening 1410 formed at a location corresponding to the first device region 101. Subsequently, the substrate 10 may be etched based on the first opening 1410 to form the first trench 1011 with a depth H0. The first trench 1011 may be formed with, e.g., dry etch process and may have a depth H0 of approximately 1200 Å to approximately 1600 Å. It is to be noted that "depth" herein may refer to the distance extending downward from the top surface of the substrate 10 in a longitudinal direction perpendicular to the lateral direction of the substrate 10.

Figure 2C:
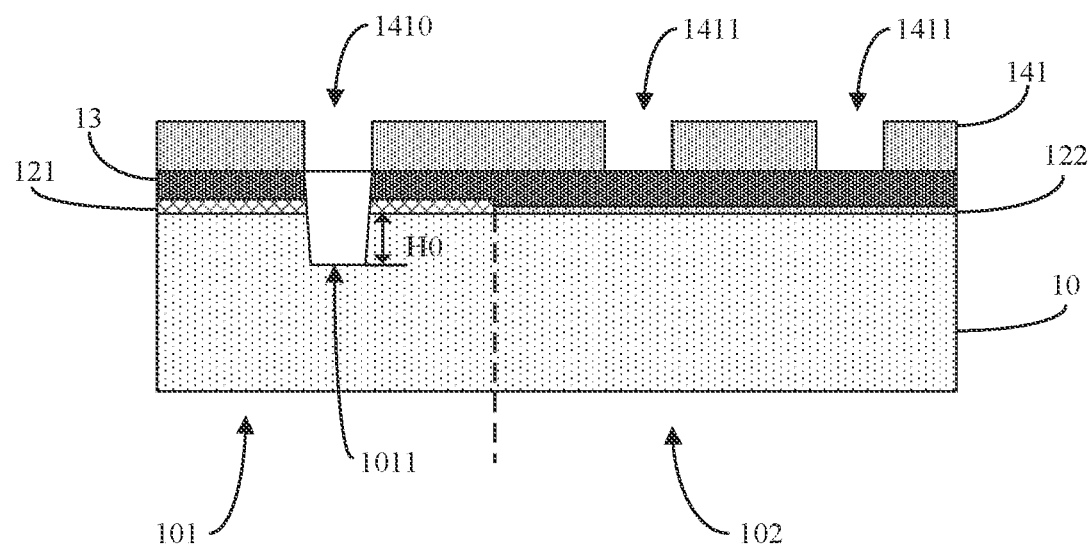
Figure 2D:
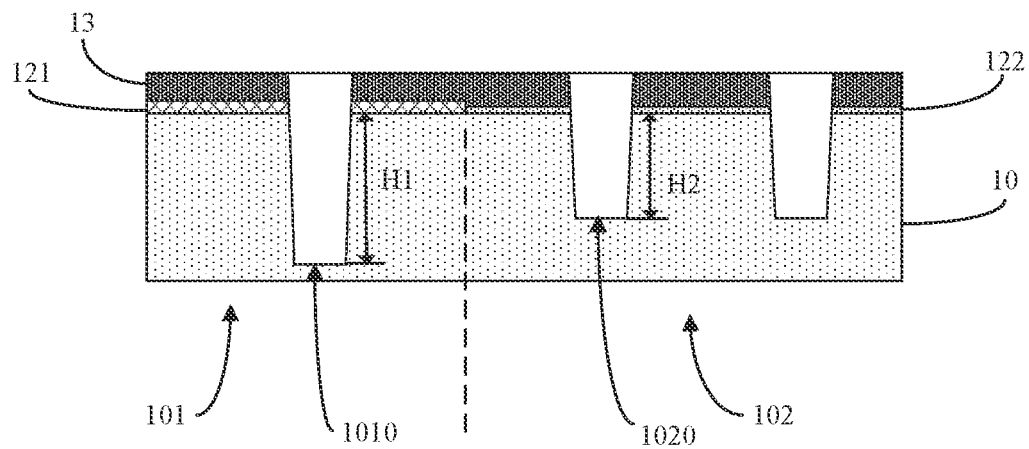

2) The substrate 10 of the first device region 101 and the second device region 102 may be etched to form a first isolation groove 1010 correspondingly at a location of the first trench 1011 and form a second isolation groove 1020 in the second device region 102, as shown in FIGS. 2c-2d.

In some embodiments, a second opening 1411 may be formed at a location corresponding to the second device region 102 in the photoresist layer 141. As shown in FIG. 2c, the second opening 1411 may include two openings located in different locations. Subsequently, the substrate 10 may be continuously etched based on the first opening 1410 and the second opening 1411 to form the first isolation groove 1010 at the location of the first trench 1011 and form the second isolation groove 1020 in the second device region 102. In some instances, subsequently, the photoresist layer 141 may be removed. The depth H1 of the first isolation groove 1010 in the longitudinal direction may be greater than the depth H2 of the second isolation groove 1020 in the longitudinal direction, and the difference between the depths of the first isolation groove 1010 and the second isolation groove 1020 may approximately equal to the depth H0 of the first trench 1011 in the longitudinal direction. For example, the depth H1 of the first isolation groove 1010 may be approximately 4500 Å to approximately 4700 Å, the depth H2 of the second isolation groove 1020 may be approximately 3100 Å to approximately 3300 Å, and the depth H0 of the first trench 1011 may be approximately 1400 Å.

Figure 2E:
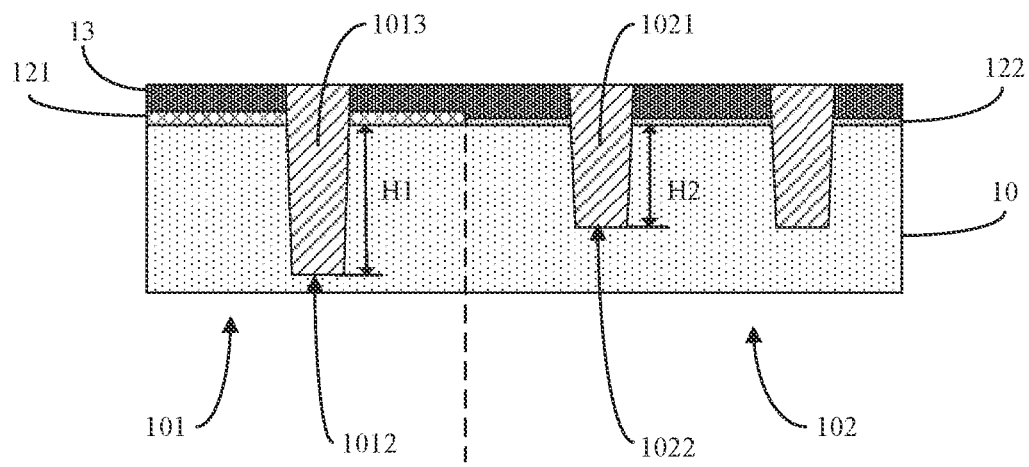

In some embodiments, the first isolation groove 1010 and the second isolation groove 1020 may be filled with a first insulating layer 1013 and a second insulating layer 1021 respectively to form the first isolation structure 1012 in the substrate 10 of the first device region 101 and form the second isolation structure 1022 in the substrate 10 of the second device region 102, as shown in FIG. 2e.

In some embodiments, the first insulating layer 1013 and the second insulating layer 1021 may include the same material, for example, silicon oxide.

Turning back to FIG. 1, at S3, ion implantation may be performed on the first isolation structure 1012.

Figure 2F:
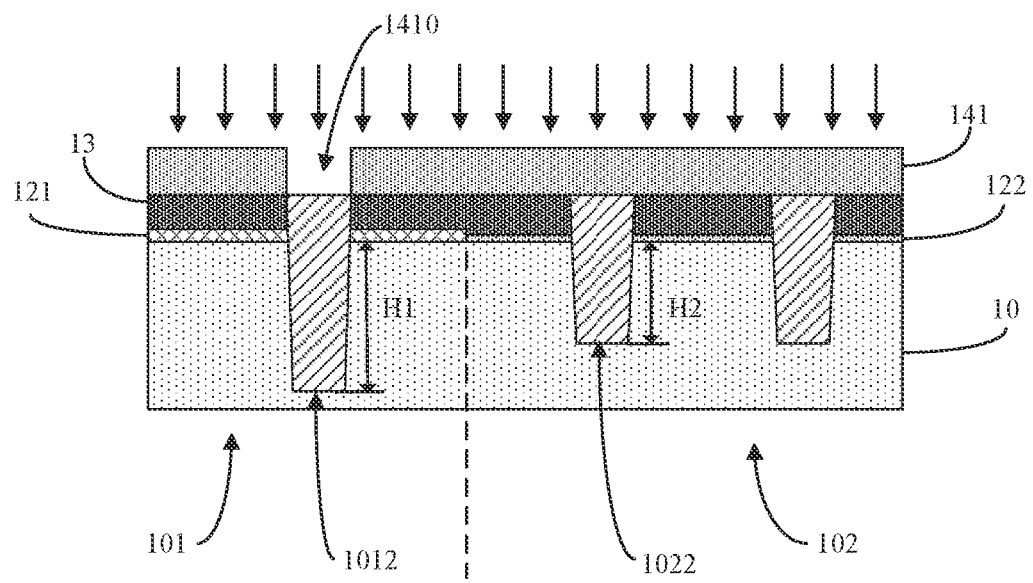

As shown in FIG. 2f, another photoresist layer 141 may be formed continuously on the hard mask layer 13. In some embodiments, the photoresist layer 141 may have a first opening 1410 at the location corresponding to the first isolation structure 1012. The first isolation structure 1012 may be bombarded with ion implantation process, such that the crystal lattice of the first isolation structure 1012 may be scattered, thereby the compactness of the first isolation structure 1012 can be changed. Further, the etching rate for the first isolation structure 1012 can be increased. The second isolation structure 1022 may be masked by the photoresist layer 141, so the second isolation structure 1022 will not undergo the ion implantation process.

At S4: The first isolation structure 1012 and the second isolation structure 1022 may be etched back (again) to form a first recess 1014 in the first isolation structure 1012 and a second recess 1023 in the second isolation structure 1022. The depth H3 of the first recess 1014 in the longitudinal direction perpendicular to the lateral direction of the substrate 10 may be greater than the depth H4 of the second recess 1023 in the longitudinal direction.

Figure 2G:
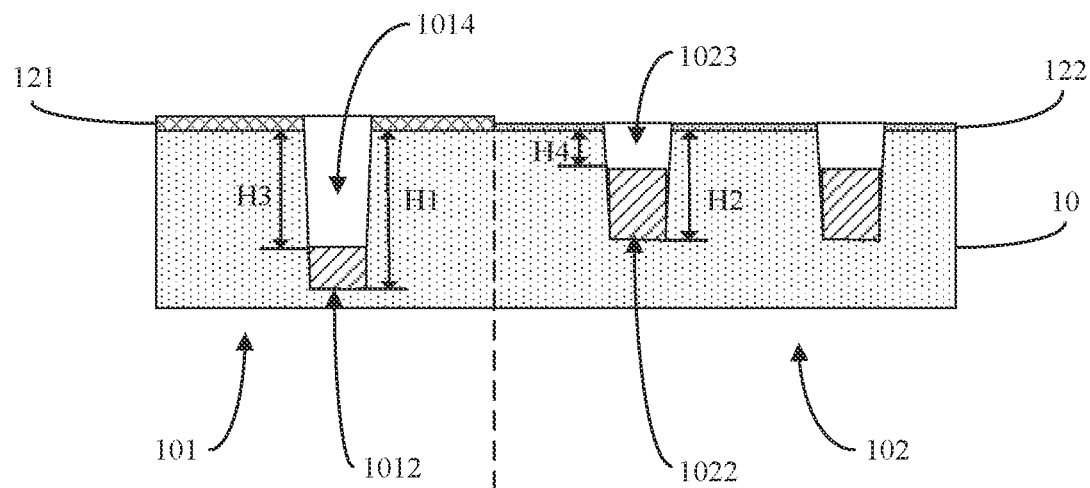

In some embodiments, as shown in FIG. 2g, the first isolation structure 1012 and the second isolation structure 1022 may be etched (back) again to form a first recess 1014 and a second recess 1023 in the first isolation structure 1012 and the second isolation structure 1022 respectively. The etch rate for the first isolation structure 1012 may be greater than that for the second isolation structure 1022, so the depth H3 of the etched first recess 1014 may be greater than the depth H4 of the second recess 1023.

Figure 2H:
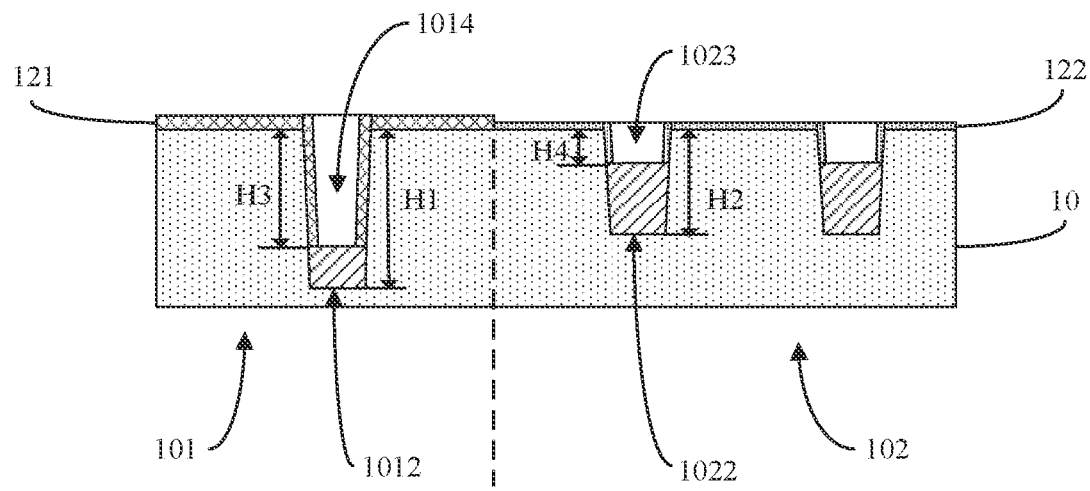

Referring to FIGS. 2h-2k, the method provided in some embodiments of the present disclosure may further include:

1) The first gate oxide layer 121 may be formed on sidewalls of the first recess 1014 and the second gate oxide layer 122 may be formed on sidewalls of the second recess 1023, as shown in FIG. 2h. The exposed surface of the substrate 10 on the sidewalls of the first recess 1014 and the second recess 1023 may be, e.g., oxidized with a furnace oxidation process to form the first gate oxide layer 121 and the second gate oxide layer 122 on the sidewalls of the first recess 1014 and the second recess 1023 respectively such that the first gate oxide layer 121 may be located on the sidewalls of the first recess 1014 and the surface of the substrate 10, and the second gate oxide layer 122 may be located on the sidewalls of the second recess 1023 and the surface of the substrate 10.

Figure 2I:
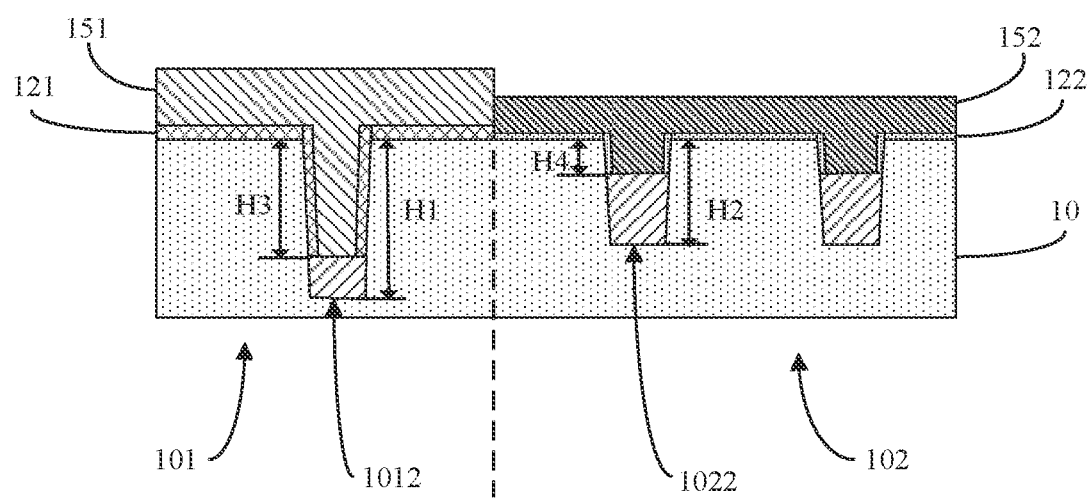

2) A first gate layer 151 may be formed on the surface of the first gate oxide layer 121. The first gate oxide layer 121 and the first gate layer 151 may constitute a first gate structure. A second gate layer 152 may be formed on the surface of the second gate oxide layer 122. The second gate oxide layer 122 and the second gate layer 152 may constitute a second gate structure. In some embodiments, the first gate layer 151 may be formed on the surface of the substrate 10 of the first recess 1014 and the first device region 101, and a second gate layer 152 may be formed on the surface of the substrate 10 of the second recess 1023 and the second device region 102. In some embodiments, a material for the first gate layer 151 and the second gate layer 152 may include polysilicon, and the thickness of the first gate layer 151 can be greater than that of the second gate layer 152, as shown in FIG. 2i.

Figure 2J:
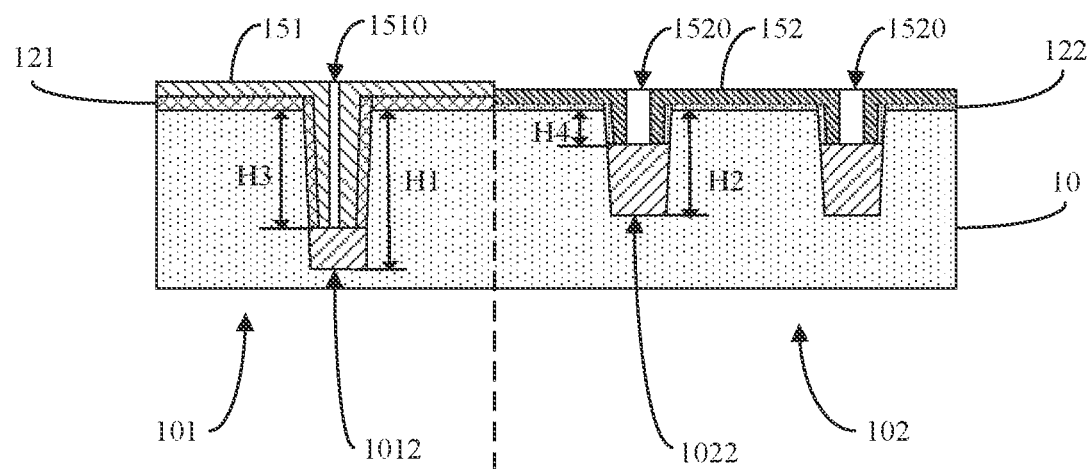

3) The first gate layer 151 and the second gate layer 152 may be etched to form a first isolation trench 1510 in the first gate layer 151 and a second isolation trench 1520 in the second gate layer 152. The first isolation trench 1510 may penetrate the first gate layer 151 to separate it into different parts, e.g., left and right portions, and the second isolation trench 1520 may penetrate the second gate layer 152 to separate it into different parts, e.g., left and right portions. Consequently, the first gate layer 151 on the surface of the first gate oxide layer 121 and the second gate layer 152 on the surface of the second gate oxide layer 122 may be formed, as shown in FIG. 2j. The first gate layer 151 may be isolated by the first isolation trench 1510 in the first isolation structure 1012, and the second gate layer 152 may be isolated by the second isolation trench 1520 in the second isolation structure 1022.

Figure 2K:
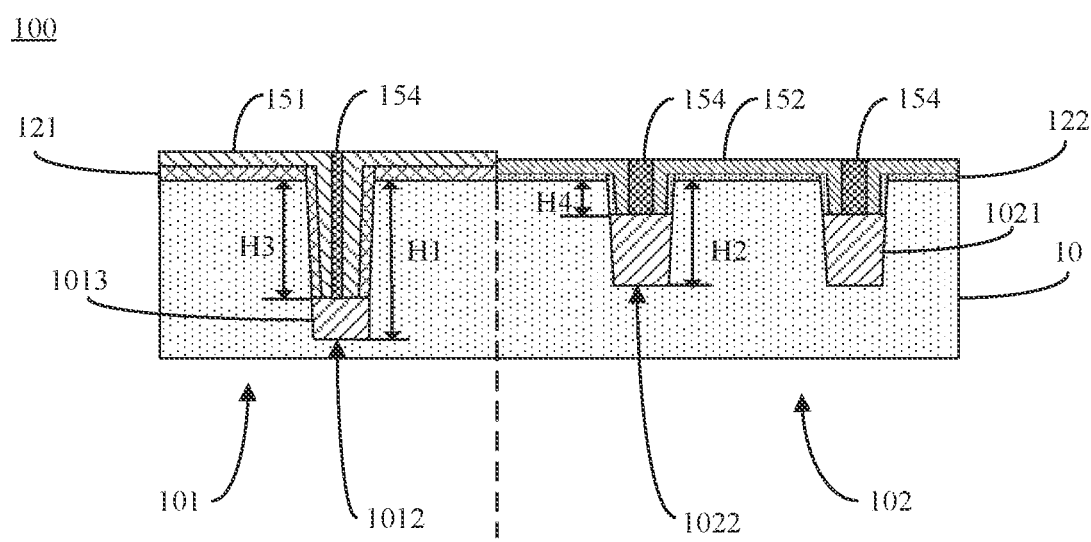

4) The first isolation trench 1510 and the second isolation trench 1520 may be filled with insulating material 154 (as shown in FIG. 2k), e.g., silicon dioxide.

As described, the depth of the first recess 1014 may be greater than that of the second recess 1023, so the area of the first gate oxide layer 121 formed on the sidewalls of the first recess 1014 may be greater than that of the second gate oxide layer 122 formed on the sidewalls of the second recess 1023. Consequently, this can increase the speed of devices in the first device region 101.

The method may further include forming high voltage well regions among the plurality of first isolation structures 1012 and forming low voltage well regions among the plurality of second isolation structures 1022.

In some embodiments, the substrate 10 including the first device region 101 and the second device region 102 may be provided. Subsequently, the first isolation structure 1012 may be formed in the substrate 10 of the first device region 101, and the second isolation structure 1022 may be formed in the substrate 10 of the second device region 102. Ion implantation on the first isolation structure 1012 may be performed, and the first isolation structure 1012 and the second isolation structure 1022 may be etched back to form the first recess 1014 in the first isolation structure 1012 and the second recess 1023 in the second isolation structure 1022. The first isolation structure 1012 that may have been bombarded by ions may have a faster etch rate, so the depth of the first recess 1014 may be greater than that of the second recess 1023. Consequently, it could satisfy the requirement of the deeper junction depth in the first device region 101, thereby further satisfying the derive performance demands.

In some embodiments of the present disclosure, a semiconductor device formed with the above described method may be provided. As shown in FIG. 2k, the semiconductor device 100 may include: a substrate 10 including a first device region 101 and a second device region 102. The semiconductor device 100 may further include a first isolation structure 1012 in the substrate 10 of the first device region 101, and the first isolation structure 1012 may include a first insulating layer 1013 at the bottom. The semiconductor device 100 may include a second isolation structure 1022 in the substrate 10 of the second device region 102, and the second isolation structure 1022 including a second insulating layer 1021 at the bottom. The semiconductor device 100 may further include a first gate structure between the first device region 101 and the first isolation structure 1012 and on the first insulating layer 1013, and the first gate structure may include a first gate oxide layer 121 and a first gate layer 151 on the surface of the first gate oxide layer 121. The semiconductor device 100 may include a second gate structure between the second device region 102 and the second isolation structure 1022 and on the second insulating layer 1021, and the second gate structure may include a second gate oxide layer 122 and a second gate layer 152 on the surface of the second gate oxide layer 122. The depth H3 of the first gate structure (or the first gate oxide layer 121) in the longitudinal direction perpendicular to the lateral direction of the substrate 10 may be greater than the depth H4 of the second gate structure (or the second gate oxide layer 122) in the longitudinal direction. There may be implanted ions in the first insulating layer 1013, and there may be no implanted ions in the second insulating layer 1021. The depth H3 of the first gate oxide layer 121 may be greater than the depth H4 of the second gate oxide layer 122, so the area of the first gate oxide layer 121 may be greater than that of the second gate oxide layer 122.

In some embodiments, the depth H1 of the first isolation structure 1012 in the longitudinal direction may be greater than the depth H2 of the second isolation structure 1022 in the longitudinal direction.

The semiconductor device 100 may further include: the first gate structure on the surface of the substrate 10 of the first device region 101 and the second gate structure on the surface of the substrate 10 of the second device region 102.

The semiconductor device 100 may be formed with the method according to some embodiments of the present disclosure and thus may have the beneficial effects described above.

In summary, the present disclosure has been disclosed above with reference to some embodiments; however, the embodiments above are not used to limit the disclosure. On the contrary, variations and modifications may be made by those of ordinary skills in the art without departing from the spirit and scope of the present disclosure, which has a scope only defined by the following claims.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The Summary and Abstract sections may set forth one or more but not all exemplary embodiments of the present disclosure as contemplated by the inventor(s), and thus, are not intended to limit the present disclosure and the appended claims in any way.

Various embodiments are disclosed above. The particular arrangements provided are illustrative and without limitation. Accordingly, certain steps, functions, and/or configurations may be re-ordered or combined in diverse ways than in the examples provided above. Likewise, certain embodiments that include only a subset of the steps, functions, and configurations may be permitted.

The breadth and scope of the present disclosure should not be limited by any of the above-described exemplary embodiments but should be defined only in accordance with the following claims and their equivalents.

What is claimed is:

1. A semiconductor device, comprising:
a first isolation structure corresponding to a first device region of a substrate and comprising a first insulating layer in a first isolation groove of the first isolation structure;
a second isolation structure corresponding to a second device region of the substrate and comprising a second insulating layer in a second isolation groove of the second isolation structure;
a first gate structure arranged on sidewalls of the first isolation groove and comprising a first gate oxide layer and a first gate layer; and
a second gate structure arranged on sidewalls of the second isolation groove and comprising a second gate oxide layer and a second gate layer,
wherein:
a depth of the first gate structure in a longitudinal direction, perpendicular to a lateral direction of the substrate, is greater than a depth of the second gate structure in the longitudinal direction; and
the first gate layer is discontinuous in the first isolation groove.

2. The semiconductor device of claim 1, wherein:
a depth of the first isolation groove in the longitudinal direction is greater than the depth of the second isolation groove in the longitudinal direction.

3. The semiconductor device of claim 2, wherein:
the depth of the first isolation groove is approximately 4500 Å to approximately 4700 Å; and
the depth of the second isolation groove is approximately 3100 Å to approximately 3300 Å.

4. The semiconductor device of claim 1, wherein:
an area of the first gate oxide layer on the sidewalls of the first isolation groove is greater than an area of the second gate oxide layer on the sidewalls of the second isolation groove.

5. The semiconductor device of claim 1, wherein:
the first gate oxide layer is further arranged on the substrate of the first device region, and the second gate oxide layer is further arranged on the substrate of the second device region, a thickness of the first gate oxide layer on the substrate of the first device region being greater than a thickness of the second gate oxide layer on the substrate of the second device region.

6. The semiconductor device of claim 5, wherein:
the first gate layer is further arranged on a surface of the first gate oxide layer on the substrate; and
the second gate layer is further arranged on a surface of the second gate oxide layer on the substrate.

7. The semiconductor device of claim 1, wherein:
a first insulating layer is arranged in the first isolation groove, the first gate oxide layer and the first gate layer on the sidewalls of the first isolation groove being arranged between the substrate and the first insulating layer; and
a second insulating layer is arranged in the second isolation groove, the second gate oxide layer and the second gate layer on the sidewalls of the second isolation groove being arranged between the substrate and the second insulating layer.

8. The semiconductor device of claim 1, wherein:
a first insulating material is inserted into and between the first gate layer over the first insulating layer to separate the first gate layer into two parts in the first isolation groove.

9. The semiconductor device of claim 8, wherein:
the first insulating material is in contact with the first insulating layer in the first isolation groove.

10. The semiconductor device of claim 1, further comprising:
a first insulating material inserted into and arranged between the first gate layer over the first insulating layer, the first insulating material being configured to separate the first gate layer into two parts in the first isolation groove; and
a second insulating material inserted into and arranged between the second gate layer over the second insulating layer, the second insulating material being configured to separate the second gate layer into two parts in the second isolation groove.

11. The semiconductor device of claim 10, wherein:
in the longitudinal direction, a length of the first insulating material is greater than a length of the second insulating material.

12. The semiconductor device of claim 1, wherein:
a bottom of the first insulating layer in the first isolation groove is lower than a bottom of the second insulating layer in the second isolation groove, in the longitudinal direction.

13. A semiconductor device, comprising:
a first semiconductor device arranged in a first region of a substrate and comprising a first insulating layer in a first isolation groove of the substrate and a first gate structure over the first insulating layer, wherein the first gate structure comprises:
a first gate oxide layer arranged over sidewalls of the first isolation groove;
a first gate layer arranged over the first gate oxide layer; and
a first insulating material arranged over the first insulating layer and inserted between the first gate layer; and
a second semiconductor device arranged in a second region of the substrate and comprising a second insulating layer in a second isolation groove of the substrate and a second gate structure over the second insulating layer, wherein the second gate structure comprises:
a second gate oxide layer arranged over sidewalls of the second isolation groove;
a second gate layer arranged over the second gate oxide layer; and
a second insulating material arranged over the second insulating layer and inserted between the second gate layer,
wherein:
the first insulating material is identical to the second insulating material; and
a thickness of the first gate oxide layer is greater than a thickness of the second gate oxide layer.

14. The semiconductor device of claim 13, wherein:
in a longitudinal direction perpendicular to a lateral direction of the substrate, a bottom of the first insulating layer in the first isolation groove is lower than a bottom of the second insulating layer in the second isolation groove.

15. The semiconductor device of claim 13, wherein:
an area of the first gate oxide layer over the sidewalls of the first isolation groove is greater than an area of the second gate oxide layer over the sidewalls of the second isolation groove.

16. The semiconductor device of claim 13, wherein:
in a longitudinal direction perpendicular to a lateral direction of the substrate, a length of the first insulating material is greater than a length of the second insulating material.

17. The semiconductor device of claim 13, wherein:
the first insulating material is configured to separate the first gate layer into two parts in the first isolation groove; and
the second insulating material is configured to separate the second gate layer into two parts in the second isolation groove.

18. A semiconductor device, comprising:
a first semiconductor device arranged in a first region of a substrate and comprising a first insulating layer in a first isolation groove of the substrate and a first gate structure over the first insulating layer, wherein the first gate structure comprises:
 a first gate oxide layer arranged over sidewalls of the first isolation groove; and
 a first gate layer arranged over the first gate oxide layer; and
a second semiconductor device arranged in a second region of the substrate and comprising a second insulating layer in a second isolation groove of the substrate and a second gate structure over the second insulating layer, wherein the second gate structure comprises:
 a second gate oxide layer arranged over sidewalls of the second isolation groove; and
 a second gate layer arranged over the second gate oxide layer,
wherein:
a bottom of the first insulating layer in the first isolation groove is lower than a bottom of the second insulating layer in the second isolation groove in a longitudinal direction perpendicular to a lateral direction of the substrate.

19. The semiconductor device of claim 18, further comprising:
a first insulating material arranged over the first insulating layer and inserted between the first gate layer.

20. The semiconductor device of claim 19, wherein:
the first insulating material is in contact with the first insulating layer in the first isolation groove.

* * * * *